United States Patent [19]

Hoover

[11] 4,032,851

[45] June 28, 1977

[54] COMPLEMENTARY SYMMETRY FET MIXER CIRCUITS

[75] Inventor: Merle Vincent Hoover, Flemington, N.J.

[73] Assignee: RCA Corporation, New York, N.Y.

[22] Filed: May 7, 1976

[21] Appl. No.: 684,405

[52] U.S. Cl. .............................. 325/451; 325/450; 307/304; 363/163

[51] Int. Cl.² .......................................... H04B 1/28

[58] Field of Search .......... 325/446, 449, 450, 451, 325/442; 321/60, 65, 69 NL; 307/279, 288, 304, 251; 330/13, 15, 20, 21, 31, 69

[56] References Cited

UNITED STATES PATENTS

| | | | |
|---|---|---|---|
| 2,088,432 | 7/1937 | Peterson | 325/450 |
| 2,538,715 | 1/1951 | Van Weel | 325/450 |
| 3,383,601 | 5/1968 | Squires | 325/450 |
| 3,727,078 | 4/1973 | Wollesen | 307/304 |

Primary Examiner—Robert L. Griffin
Assistant Examiner—Jin F. Ng
Attorney, Agent, or Firm—H. Christoffersen; S. Cohen; A. L. Limberg

[57] ABSTRACT

Series connected field-effect transistors (FET's) of complementary conductivity types are employed to mix two input signals. The transistors are biased in their linear operating region and operate as common source amplifiers for the signals to be mixed. The input signals are applied to the respective gate electrodes of the transistors and the output signal containing upper and lower sideband frequencies is available at the common drain connection of the transistors.

9 Claims, 4 Drawing Figures

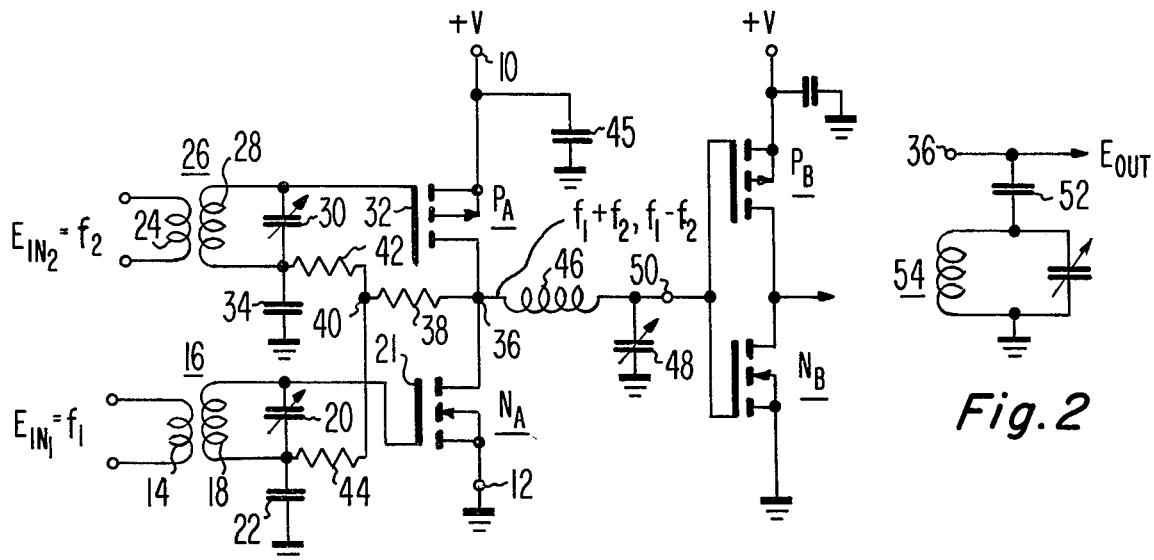
Fig.1
Fig.2
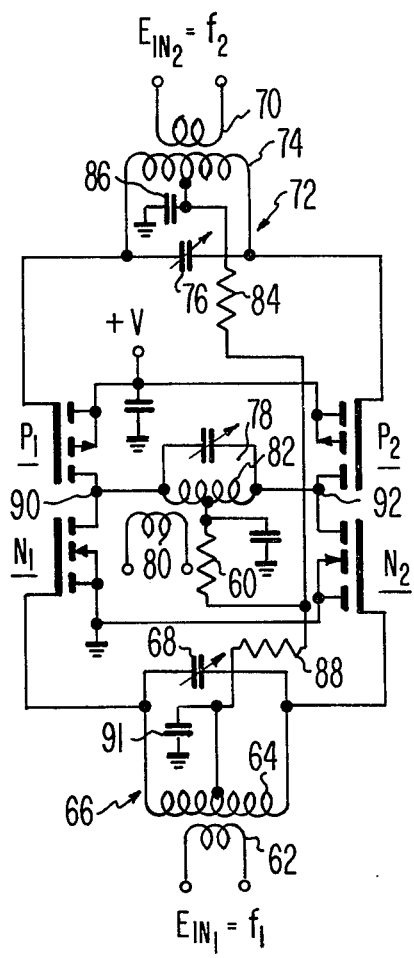
Fig.3
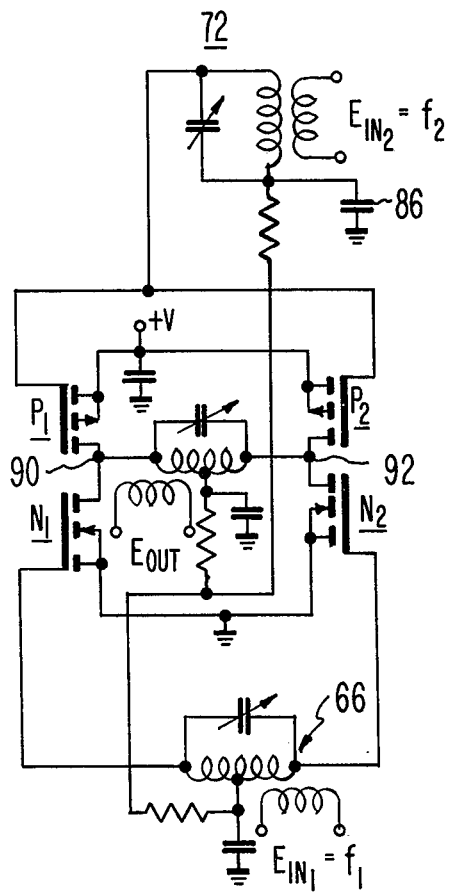
Fig.4

COMPLEMENTARY SYMMETRY FET MIXER CIRCUITS

This invention relates generally to mixer circuits and more particularly to such circuits employing field effect transistors (FET's).

FET's, such as those of the metal oxide semiconductor (MOS) type, are widely used in mixer circuits. One form of transistor which is particularly popular is the dual-gate, N-channel, depletion-mode, MOS/FET device. It is usually operated in the cascode mode; that is, one of the gate electrodes of the transistor to which the signal at one frequency is applied serves as an input to a common source amplifier and the other gate electrode to which the signal at a second frequency is applied serves as an input to a common gate stage. Such circuit configurations tend to be complex in the sense that a fair number of peripheral elements, such as resistors, are required. Other mixer circuits employ individual FET's of the same conductivity type and these too require a substantial number of peripheral components. A typical mixer circuit of the latter type is shown in the RCA Solid State 1975 DataBook Series SSD-202C, page 83, FIG. 32.

The circuits of the present application employ complementary symmetry field-effect transistors such as those of the MOS type. These circuits employ common-source amplifiers to process both of the frequencies to be mixed, even though the two amplifiers are series connected as viewed by the DC power supply. Operation in the common source mode permits optimum gain to be obtained from both stages of the mixer and, in addition, the circuits are relatively simple and therefore relatively inexpensive.

In the drawing:

FIG. 1 is a schematic circuit diagram of a single-ended mixer embodying the invention;

FIG. 2 shows a portion of the circuit of FIG. 1 in modified form;

FIG. 3 is a schematic circuit diagram of a push-pull mixer embodying the invention; and FIG. 4 is a circuit diagram of a balanced mixer embodying the invention.

Referring first to FIG. 1, two transistors $P_A$ and $N_A$ of complementary conductivity types have their conduction paths connected in series between a terminal 10 for an operating voltage +V and a terminal 12 at a reference voltage level, shown here as ground. These transistors may be of the MOS enhancement type and together may be referred to as a COS/MOS amplifier. A first input signal $E_{IN1}$, which may be at a carrier frequency $f_1$, is supplied to the primary winding 14 of transformer 16. The secondary winding 18 of this transformer forms with tunable capacitor 20 a parallel-resonant circuit tuned to frequency $f_1$. This circuit is connected at one terminal to the gate electrode 21 of N-type transistor $N_A$ and at its other terminal through a decoupling capacitor 22 to ground. The second input signal $E_{IN2}$, which may be at a modulating frequency $f_2$, is applied to the primary winding 24 of a transformer 26. Its secondary winding 28 and variable capacitor 30 together form a parallel resonant circuit tuned to frequency $f_2$. This circuit is connected at one terminal to the gate electrode 32 of P-type transistor $P_A$ and at its other terminal is connected to ground through decoupling capacitor 34.

The common drain electrode connection 36 of the transistors $P_A$ and $N_A$ is connected through biasing resistor 38 to circuit node 40. This node connects via a first direct current path including resistor 42 to the gate electrode 32 of transistor $P_A$ and via a second direct current paht including resistor 44 to the gate electrode 21 of the second transistor $N_A$. Normally, the resistors 42 and 44 are of the same value and of much lower resistance than resistor 38. For example, biasing resistor 38 may have a value of 22 megohms and resistors 42 and 44 may each have a resistance of 100 K ohms. (The same is true of the biasing and decoupling resistors of the FIG. 3 and 4 circuits.) The source electrodes of transistors $P_A$ and $N_A$ are held at AC ground by direct connection in the case of $N_A$ and by capacitor 45 in the case of $P_A$.

The output circuit of the mixer may be a series tuned circuit which includes coil 46 and variable capacitor 48. This circuit is tuned to a desired output signal which may be at the upper $(f_1 + f_2)$ or the lower $(f_1 - f_2)$ sideband frequency.

In operation, the biasing resistor 38 (together with resistors 42 and 44, respectively) bias the COS/MOS amplifier at or close to the center of its linear operating range. In other words, the biasing is such that transistors $N_A$ and $P_A$ both quiescently conduct. The two signals to be mixed are applied to the primary windings 14 and 24, respectively, and cause conduction through the respective transistors $N_A$ and $P_A$ to vary in accordance with the relative amplitudes of these signals. With respect to these AC signals, each amplifier operates in the common-source mode and therefore permits optimum gain to be obtained from its transistor. If the circuit is perfectly symmetrical, as should be the case when the circuit is fabricated in integrated form, resistors 42 and 44 may be of the same value.

The output signal appears at the common drain connection 36 and it includes, among other components, the two sideband frequencies of interest, namely $f_1 + f_2$ and $f_1 - f_2$. The series resonant circuit is tuned to one of these frequencies for supplying the signal at this frequency to the following stage. In one particular advantageous configuration for integrated circuit implementation, the subsequent stage is a second COS/MOS amplifier, as shown. It is advantageous because no additional quiescent bias circuit is needed, as the mixer stage $P_A$, $N_A$ itself automatically provides the correct bias level via the DC path through coil 46. In similar fashion, if there are following COS/MOS stages they too can make use of this same source of quiescent bias. It is possible to have a number of such stages receive bias from the same source because they have very high input impedance and do not draw any significant amount of DC current. In a preferred embodiment, the following stages such as $P_B$, $N_B$ are integrated onto the same substrate as transistors $P_A$ and $N_A$.

The RC networks 42, 34 and 44, 22 serve as bias decoupling networks. A bypass capacitor such as 22 does not have zero ohms reactance at frequency $f_1$. Consequently, a small increment of the input voltage signal $f_1$ is developed across capacitor 22. A resistor such as 44 attenuates some of this incremental signal at frequency $f_1$ which would otherwise pass to tuned circuit 28, 30 and possibly introduce undesired effects. The network 34, 42 performs a similar function for signals at frequency $f_2$, and both networks attenuate feedback signal from terminal 36.

A number of alternative forms of the circuit of FIG. 1 are possible. For example, a parallel resonant circuit such as shown in FIG. 2 may be substituted for the series resonant circuit of FIG. 1. The capacitor 52 serves to isolate the output lead from ground with respect to DC but provides a low impedance path to the various AC frequency components which are present. Capacitor 52 may instead be inserted between the ground connection and the circuit 54, the choice being dependent on the characteristics of the following circuit. As a third alternative, an appropriate Pi-network may be substituted for the parallel tuned circuit 54.

FIG. 3 illustrates a push-pull embodiment of the invention. It employs two COS/MOS amplifiers $P_1$, $N_1$ and $P_2$, $N_2$, respectively. These, like the amplifier of FIG. 1, are biased by resistor 60 to operate at the center of the linear region of their operating range. The resistor preferably is connected at one end to the center tap of coil 82 and at its other end to decoupling networks 88, 91 and 84, 86. The resistor 84 is connected at its other end to the center tap of coil 74 and resistor 88 to the center tap of coil 64.

The first input signal $E_{IN1}$ is applied to primary winding 62. The secondary winding 64 serves as the inductance of tuned circuit 66 which includes also variable capacitor 68. This tuned circuit is connected between the gate electrodes of N-type MOS transistors $N_1$ and $N_2$. In similar fashion, the second input signal $E_{IN2}$ is applied to the primary winding 70. Tuned circuit 72 comprises secondary winding 74 and variable capacitor 76. This parallel tuned circuit is connected at the two terminals thereof to the gate electrodes of P-type transistors $P_1$ and $P_2$, respectively.

FIG. 3 also includes parallel tuned circuit 78 which is connected between the common drain electrode connections of the two amplifiers. The output signal is available at the terminals of a winding 80 which is coupled to the inductor 82 of tuned circuit 78. The circuit also includes a first RC decoupling circuit 84, 86 and a second such circuit 88, 91.

The operation of the circuit should be clear from the description of FIG. 1. The first input signal at frequency $f_1$ is coupled to tuned circuit 66 whose resonant frequency is $f_1$. This circuit supplies input siganls to the N-type transistors $N_1$ and $N_2$, 180° out of phase. Similarly, tuned circuit 72, which is tuned to the second input frequency $f_2$, supplies 180° out-of-phase signals to the gate electrodes of transistors $P_1$ and $P_2$, respectively. The output parallel resonant circuit 78 is tuned to the sideband frequency of interest. For example, it may be tuned to $f_1 + f_2$ or $f_1 - f_2$. This output signal is sensed by coil 80 and is available at its output terminals.

Operation in the push-pull mode increases the amplitude of the output signal by a factor of two over that obtainable with the circuit of FIG. 1, assuming the transistors employed have the same transconductance ($g_m$) in both circuits. Another important advantage of this circuit is that the amplitude of the even harmonics which are generated is greatly reduced. The circuit is also useful in reducing the amount of "leak through" between the two signals of frequencies $f_1$ and $f_2$. If the mixer is to be used, for example, in a superhetrodyne receiver and $f_2$ is the local oscillator frequency, it is desirable to minimize the portion of this signal which may leak through to the $f_1$ port and possibly be radiated through the front end of the receiver. Such radiation is undesirable because it can act as a source of interference to other equipments. However, there is a remanent route of coupling, namely the drain-gate capacitance of the N-type transistors, by which a portion of the signal at $f_2$ may be coupled to the $f_1$ port. The signal at node 90 is 180° out of phase with the signal at node 92 and therefore any of such signals which pass through these coupling paths appear out-of-phase at the opposite terminals of parallel tuned circuit 66. They can cause a small increment of $f_2$ current flow through winding 62, which is undesirable. The even-ordered harmonics of $f_2$ are of much lower amplitude than $f_2$ and therefore the feedthrough, if any, is correspondingly lower than that of $f_2$ and is usually not significant.

The balanced mixer of FIG. 4 reduces the $f_2$ feedthrough even further. This circuit differs from the FIG. 3 circuit in that the parallel-tuned circuit 72 is connected at one terminal to radio-frequency ground through by-pass capacitor 86, and is connected at its other terminal to the gate electrodes of both transistor $P_1$ and $P_2$. Thus, the $f_2$ signals applied to these gate electrodes are in-phase and nodes 90 and 92 therefore receive $f_2$ components of the same amplitude. Any feedthrough via the drain-gate capacitance of transistors $N_1$ and $N_2$ of this $f_2$ component will therefore be at the same potential at both terminals of tuned circuit 66, and will have no effect. It is assumed here that transistor $P_1$ has characteristics similar to transistor $P_2$ and also that transistor $N_1$ has characteristics similar to those of transistor $N_2$. This assumption is a resonable one in the case of monolithic integrated circuits.

I claim:

1. A mixer circuit comprising, in combination:
   two terminals between which an operating voltage may be applied;
   two field effect transistors of complementary conductivity types, each having an input electrode, an output electrode, a conduction path between these electrodes, and a control electrode, said two paths being connected to one another at their output electrodes, and said two paths being connected in series between said terminals;
   means for quiescently biasing both control electrodes to quiescently operate both transistors in the linear region of their operating range;
   means for applying a signal at a frequency $f_1$ between the control and input electrodes of said first transistor;
   means for applying a signal at a frequency $f_2$ between the control and input electrodes of said second transistor; and
   a circuit output terminal connected to said output electrodes for supplying signals at a sum frequency $(f_1 + f_2)$ and a difference frequency $(f_1 - f_2)$.

2. A mixer circuit as set forth in claim 1, wherein said means for applying a signal at frequency $f_1$ comprises a parallel resonant circuit tuned to frequency $f_1$, and wherein said means for applying a signal at frequency $f_2$ comprises a parallel resonant circuit tuned to frequency $f_2$.

3. A mixer circuit as set forth in claim 1, further including a resonant circuit tuned to one of the frequencies $(f_1 + f_2)$ and $(f_1 - f_2)$ connected between said output terminal and another circuit point.

4. A mixer circuit as set forth in claim 3, wherein said resonant circuit comprises a parallel resonant circuit, said other circuit point comprising a point at a reference potential.

5. A mixer circuit as set forth in claim 3, wherein said resonant circuit comprises a series resonant circuit, said other circuit point comprising a point at a reference potential and further including a point on said series resonant circuit to which the control electrode of another field effect transistor may be connected.

6. A mixer circuit comprising, in combination:

two terminals between which an operating voltage may be applied, both grounded with respect to the frequencies $f_1$ and $f_2$ of interest;

a P-type MOS transistor and an N-type MOS transistor, each having a source, drain and gate electrodes, and a conduction path between the source and drain electrode, the drain electrodes of said transistors each being connected at a common terminal, and said conduction paths being connected in series between said terminals;

means for quiescently biasing said transistor to operate in the linear region of their operating characteristic;

a parallel resonant circuit tuned to frequency $f_1$ coupled between the source and gate electrodes of said N-type transistor;

first input means coupled to said parallel resonant circuit for supplying an input signal at frequency $f_1$ to said parallel resonant circuit;

a second parallel resonant circuit, this one tuned to frequency $f_2$, coupled between the source and gate electrodes of said P-type transistor;

second input means coupled to said second parallel resonant circuit for supplying an input signal at frequency $f_2$ to said second parallel resonant circuit; an output terminal connected to said common terminal for supplying signals at a sum frequency $(f_1 + f_2)$ and a difference frequency $(f_1 - f_2)$; and an output circuit tuned to one of ths sideband frequencies of $f_1 = f_2$ and $f_1 - f_2$ coupled between said output terminal and a second circuit point.

7. A mixer circuit comprising, in combination: two terminals between which an operating voltage may be applied;

four field effect transistors, the first and second of said transistors are of a first conductivity type and the third and fourth of which are of a second conductivity type complementary to the first conductivity type, each transistor having an input electrode, an output electrode and a control electrode, and each having a conduction path between its input and output electrodes, the conduction paths of said first and third transistors being connected in series between said terminals, the conduction paths of said second and fourth transistors being connected in series between said terminals in the same way as said first and third transistors, the output electrodes of said first and third transistors being connected at a first interconnection, the output electrodes of said second and fourth electrodes being connected at a second interconnection;

means for quiescently biasing all of said transistors to operate in the linear region of their operating range;

means for applying a signal of frequency $f_1$, in one phase to the control electrode of said first transists and in opposite phase to the control electrode of said second transistor;

means for applying a signal of frequency $f_2$ to the control electrodes of said third and fourth transistors; first and second output terminals respectively connected to said first and second interconnections for supplying between said first and second output terminals signals at a sum frequency $(f_1 + f_2)$ and a difference frequency $(f_1 - f_2)$; and an output circuit tuned to one of the sideband frequencies $f_1 + f_2$ and $f_1 - f_2$ connected between said first and second output terminals.

8. A mixer circuit as set forth in claim 7, wherein said means for applying a signal of frequency $f_2$ comprises means for applying said signal in the same phase to the control electrodes of the third and fourth transistors.

9. A mixer circuit as set forth in claim 7, wherein said means for applying a signal at frequency $f_2$ comprises means for applying said signal in one phase to the control electrode of the third transistor and in opposite phase to the control electrode of the fourth of said transistors.

* * * * *

UNITED STATES PATENT OFFICE
CERTIFICATE OF CORRECTION

PATENT NO. : 4,032,851

DATED : June 28, 1977

INVENTOR(S) : Merle Vincent Hoover

It is certified that error appears in the above-identified patent and that said Letters Patent are hereby corrected as shown below:

Column 5, line 37, "$f_1 = f_2$" should read -- $f_1 + f_2$ --.

Column 6, line 20, "transists" should read -- transistor -

Signed and Sealed this

Eighth Day of November 1977

[SEAL]

Attest:

RUTH C. MASON
*Attesting Officer*

LUTRELLE F. PARKER
*Acting Commissioner of Patents and Trademarks*